United States Patent
Hurtz et al.

(10) Patent No.: US 7,741,870 B2
(45) Date of Patent: Jun. 22, 2010

(54) MULTI-FUNCTION INPUT TERMINAL

(75) Inventors: Gary M. Hurtz, Shanghai (CN);
Richard L. Gray, Saratoga, CA (US);
David J. Kunst, Cupertino, CA (US)

(73) Assignee: Active-Semi, Inc., British Virgin Islands (VG)

( * ) Notice: Subject to any disclaimer, the term of this patent is extended or adjusted under 35 U.S.C. 154(b) by 179 days.

(21) Appl. No.: 11/888,606

(22) Filed: Aug. 1, 2007

(65) Prior Publication Data

US 2009/0033363 A1 Feb. 5, 2009

(51) Int. Cl.
*H03K 17/16* (2006.01)
*H03K 19/21* (2006.01)
*H03K 19/0175* (2006.01)

(52) U.S. Cl. ............................. 326/82; 326/57; 326/30
(58) Field of Classification Search .................. 326/30, 326/56, 57
See application file for complete search history.

(56) References Cited

U.S. PATENT DOCUMENTS 7,038,502 B2 * 5/2006 Yamaguchi ................. 327/108

* cited by examiner

*Primary Examiner*—Rexford N Barnie
*Assistant Examiner*—Thienvu V Tran
(74) *Attorney, Agent, or Firm*—Imperium Patent Works; T. Lester Wallace; Darien K. Wallace

(57) ABSTRACT

A single terminal is usable to configure an integrated circuit into one of three states. A circuit within the integrated circuit is coupled to the terminal and determines whether the terminal: 1) is tied low by an external connection, or 2) is tied high by an external connection, or 3) is floating or is substantially floating. If the circuit determines that the terminal is floating or is substantially floating, then the circuit sets an operational characteristic of a portion of the circuit (for example, sets a maximum current with which the circuit charges a battery) to have a value that is a function of a resistance of an external resistor coupled to the terminal. If no external resistor is present, then the terminal is floating and the operational characteristic is set to have a zero value. The terminal and circuit are particularly suited to use in a USB battery charger.

23 Claims, 5 Drawing Sheets

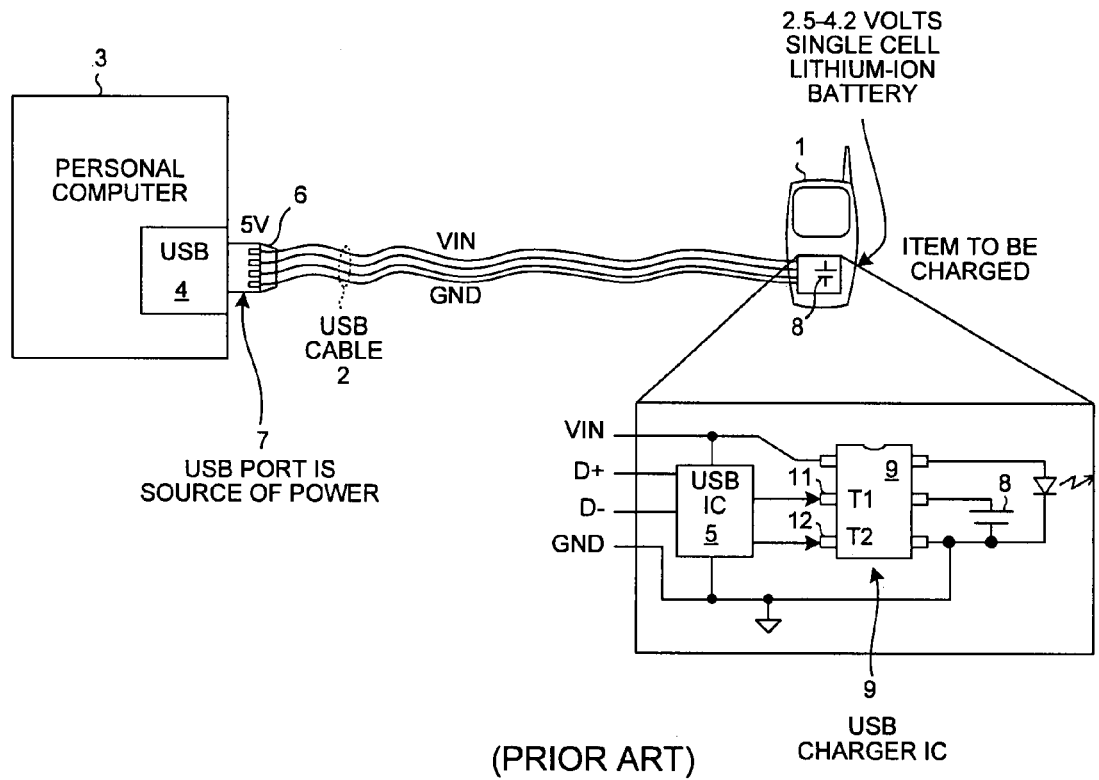
(PRIOR ART)
FIG. 1
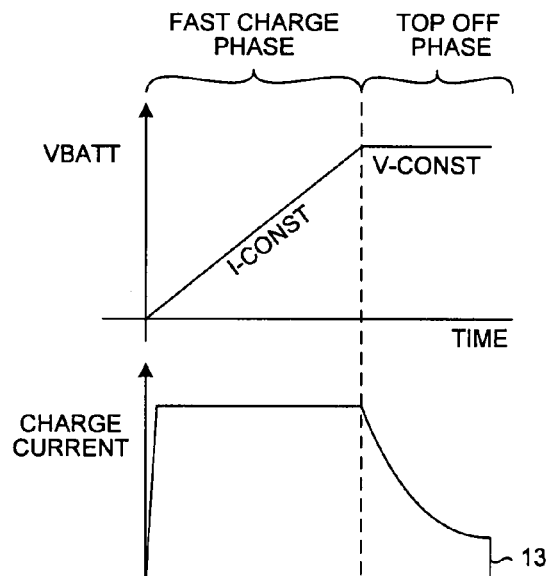
(PRIOR ART)
FIG. 2
(PRIOR ART)
FIG. 3

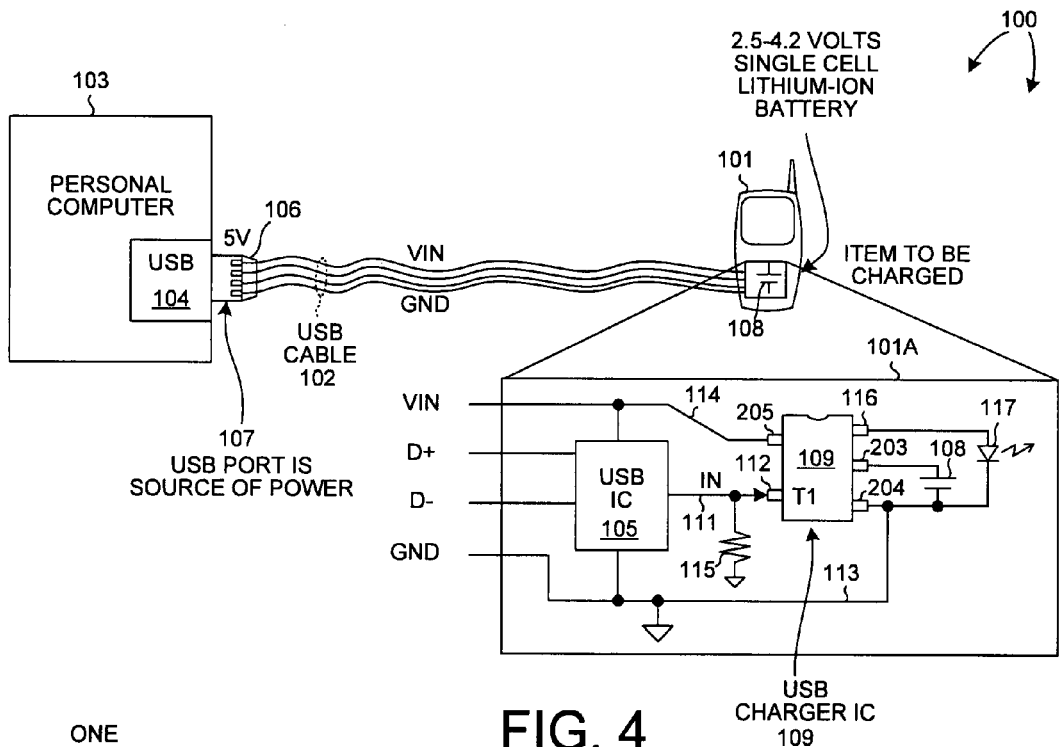
FIG. 4
| IN | FUNCTION |
|---|---|
| 0 | 100 mA |
| 1 | 500 mA |
| R | USER SET CURRENT (12E6/R mA) |
FIG. 6
| TERMINAL | FUNCTION |
|---|---|
| VIN | SUPPLY VOLTAGE (5.0 VOLTS) |
| IN | INPUT TERMINAL |
| GND | GROUND |
| VBATT | BATTERY CHARGE TERMINAL |
| CHARGE FINISH | CHARGE FINISH INDICATION |
FIG. 7
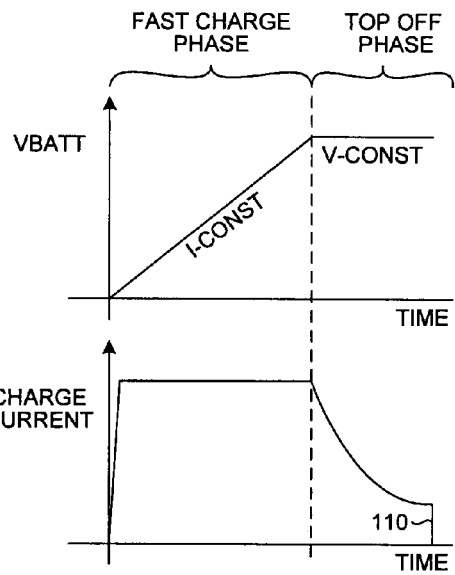
FIG. 5

I3 < I1 SO THAT M2 AND M3 ARE BIASED ON "WEAKLY".
I1 IS APPROXIMATELY EQUAL TO I2.

| IN | A | AB | B | BB | STATE | FUNCTION |
|---|---|---|---|---|---|---|
| 0 (TIED TO GND) | 1 | 0 | 1 | 0 | Q0 | 100 mA |
| 1 (TIED TO VIN) | 0 | 1 | 0 | 1 | Q1 | 500 mA |
| LARGE RESISTANCE RUSER TO GROUND | 0 | 1 | 1 | 0 | Q2 | USER SET CURRENT (12E6/R mA) |

ALTERNATIVE BIASING NETWORK

| GPIOA | GPIOB | IC 109 DETECTS | CHARGE CURRENT |
|-------|-------|----------------|----------------|
| L | X | L | 100 mA |
| H | X | H | 500 mA |
| HI-Z | HI-Z | HI-Z | 0 mA/ OFF |
| HI-Z | L | R | 12E6/R mA |

ALTERNATIVE INTERCONNECTION OF A USB IC AND THE NOVEL USB BATTERY CHARGER INTEGRATED CIRCUIT

US 7,741,870 B2

MULTI-FUNCTION INPUT TERMINAL

TECHNICAL FIELD

The present disclosure relates generally to terminals of integrated circuits, where the terminals are used to receive configuration information that configures circuitry within the integrated circuit.

BACKGROUND

FIG. 1 (Prior Art) is a diagram of a USB device 1 (in this example, a cellular telephone) that is connected by a USB cable 2 to a USB host 3 (in this example, a personal computer). USB host 3 includes USB circuitry 4. USB device 1 includes USB circuitry 5. USB cable 2 has a standard USB plug 6 that plugs into an accommodating USB port 7 on USB host 3 so that the USB host can read from, and write to, the USB circuitry 5 in USB device 1 over two data lines D+ and D− in USB cable 2. USB cable 2 also provides a supply voltage power conductor VIN as well as a ground conductor GND. These conductors are usable to power circuitry that is external to USB host 3. The USB port 7 is specified to supply 5.0 volts between its conductors VIN and GND, but the USB host may, depending on the configuration, either supply a maximum of 100 milliamperes of supply current or a maximum of 500 milliamperes of supply current.

In the illustrated system, USB host 3 and USB port 7 are used to recharge a rechargeable lithium-ion battery 8 in cellular telephone 1. Accordingly, cellular telephone 1 includes a battery charger integrated circuit 9 that is coupled to USB circuitry 5. Battery charger integrated circuit 9 is also coupled to the conductors VIN and GND in USB cable 2 as illustrated. The charger integrated circuit 9 receives power from the USB cable via the supply voltage conductor VIN and the ground conductor GND, and in turn uses that power to recharge battery 8.

FIG. 2 illustrates the manner of charging. In a first fast charge phase, the battery charger integrated circuit 9 charges battery 8 with a constant current I-CONST. Then, once the battery voltage VBATT reaches a predetermined voltage V-CONST, the battery charger integrated circuit 9 switches to a constant voltage charging mode. This constant voltage mode is sometimes referred to as the "top off" phase. After charger integrated circuit 9 has transferred energy into the battery in this constant voltage charging mode such that the battery voltage VBATT has remained in a predetermined charged range for a predetermined amount of time, the battery charger integrated circuit 9 stops supplying energy to battery 8. This is illustrated by the vertical line 13 in FIG. 2.

As set forth above, USB port 7 may only be able to supply a current of 100 milliamperes of supply current, or USB port 7 may be able to supply a current of 500 milliamperes of supply current. It is desired to charge battery 8 with a higher constant current during the fast charge phase if the USB port is able to supply the increased amount of charge current. Accordingly, charger integrated circuit 9 charges during the constant current phase at 500 milliamperes if USB port 7 is able to supply 500 milliamperes of supply current across the VIN and GND conductors. USB circuitry 4 in USB host 3 writes information into the USB circuitry 5 in the cellular telephone 1 that indicates the amount of supply current that the host can output onto its USB port 7. USB circuitry 5 in turn supplies this information to the battery charger integrated circuit 9 in the form of a digital logic signal. If USB circuitry 5 drives the digital logic signal to have a first digital logic value, then the supply current has a first maximum amount (for example, 100 milliamperes), whereas if the USB circuitry 5 drives the signal to have a second digital logic value, then the supply current has a second maximum amount (for example, 500 milliamperes). Battery charger integrated circuit 9 receives this signal on a first terminal (T1) 11.

USB host 3 (in this case, the personal computer) in the present example can also enable and disable battery charging. USB circuitry 4 in USB host 3 writes a bit of information into USB circuitry 5 in cellular telephone 1. This bit of information indicates whether the charger is to be enabled or disabled. This bit of information is then passed from USB circuitry 5 to the battery charger integrated circuit 9 in the form of a second digital logic signal. The battery charger integrated circuit 9 receives this second digital logic signal on a second terminal (T2) 12. The battery charger integrated circuit 9 therefore has two terminals 11 and 12 for receiving configuration information from USB circuitry 5.

FIG. 3 illustrates the digital logic values of the first and second digital logic signals on terminals T1 and T2, and shows the corresponding way the battery charger integrated circuit 9 is configured. In a variation on the conventional USB battery charging circuit of FIG. 1, an additional external resistor may be coupled between the first terminal T1 and ground potential. The resistance of this external resistor sets a magnitude of the constant current with which the battery charger integrated circuit 9 charges battery 8 in the constant current mode in some configurations. For example, if the signal received on terminal T2 is a digital logic low, then the charger is disabled, otherwise the charger charges in accordance with FIG. 2 using a constant current in the fast charge phase, where the constant current is determined by the resistance of the external resistor coupled to terminal T1. Terminal T1 may or may not, depending on the specific conventional circuit, also be coupled to a terminal on the USB circuit 5. Improvements to the above-described conventional battery charging systems are desired.

SUMMARY

A single terminal is usable to configure an integrated circuit into one of three states (state Q0, state Q1, or state Q2). A circuit within the integrated circuit is coupled to the terminal and determines whether the terminal: 1) is tied low by an external connection, or 2) is tied high by an external connection, or 3) is floating or is substantially floating. If the circuit determines that the terminal is floating or is substantially floating, then the circuit sets an operational characteristic of a portion of the circuit (for example, sets a maximum current IBATT with which the circuit charges a battery) to have a value that is a predetermined function of a resistance of an external resistor coupled to the terminal. Accordingly, a user of the integrated circuit can set the operational characteristic to have a desired value by choosing an external resistor that has an appropriate resistance. If no external resistor is present, then the terminal is floating and circuit sets the operational characteristic to have a corresponding zero value. In a typical application, the zero value corresponds to a disable state.

The terminal and circuit are particularly suited to use in a USB battery charger. Employing the novel terminal and circuit allows the number of terminals of a USB battery charger integrated circuit to be reduced by one terminal in many applications. Reducing the number of terminals reduces manufacturing cost of a USB device (for example, a cellular telephone) employing the USB battery charger integrated circuit.

Other structures and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 1 (prior art) is a diagram of a conventional six-terminal USB battery charger integrated circuit in use in a cellular telephone.

FIG. 2 (prior art) is a diagram of how the conventional USB battery charger integrated circuit of FIG. 1 charges a rechargeable battery in the cellular telephone of FIG. 1.

FIG. 3 (prior art) is a table that illustrates how digital signals on two terminals of the conventional USB battery charger integrated circuit of FIG. 1 configure the USB battery charger integrated circuit.

FIG. 4 is a diagram of a novel system 100 involving a novel USB battery charging integrated circuit 109 in accordance with one novel aspect.

FIG. 5 is a diagram of how the novel USB battery charger integrated circuit 109 of FIG. 4 charges a rechargeable battery 108 in the cellular telephone 101 of FIG. 4.

FIG. 6 is a table that illustrates how a single terminal 112 (T1) of the novel USB battery charger integrated circuit 109 is usable to configure the USB battery charger integrated circuit 109 into one of three states.

FIG. 7 is a table that sets forth the five terminals of the USB battery charger integrated circuit 109 of FIG. 4, and the corresponding functions of the terminals.

DETAILED DESCRIPTION

Figures 8, 10:
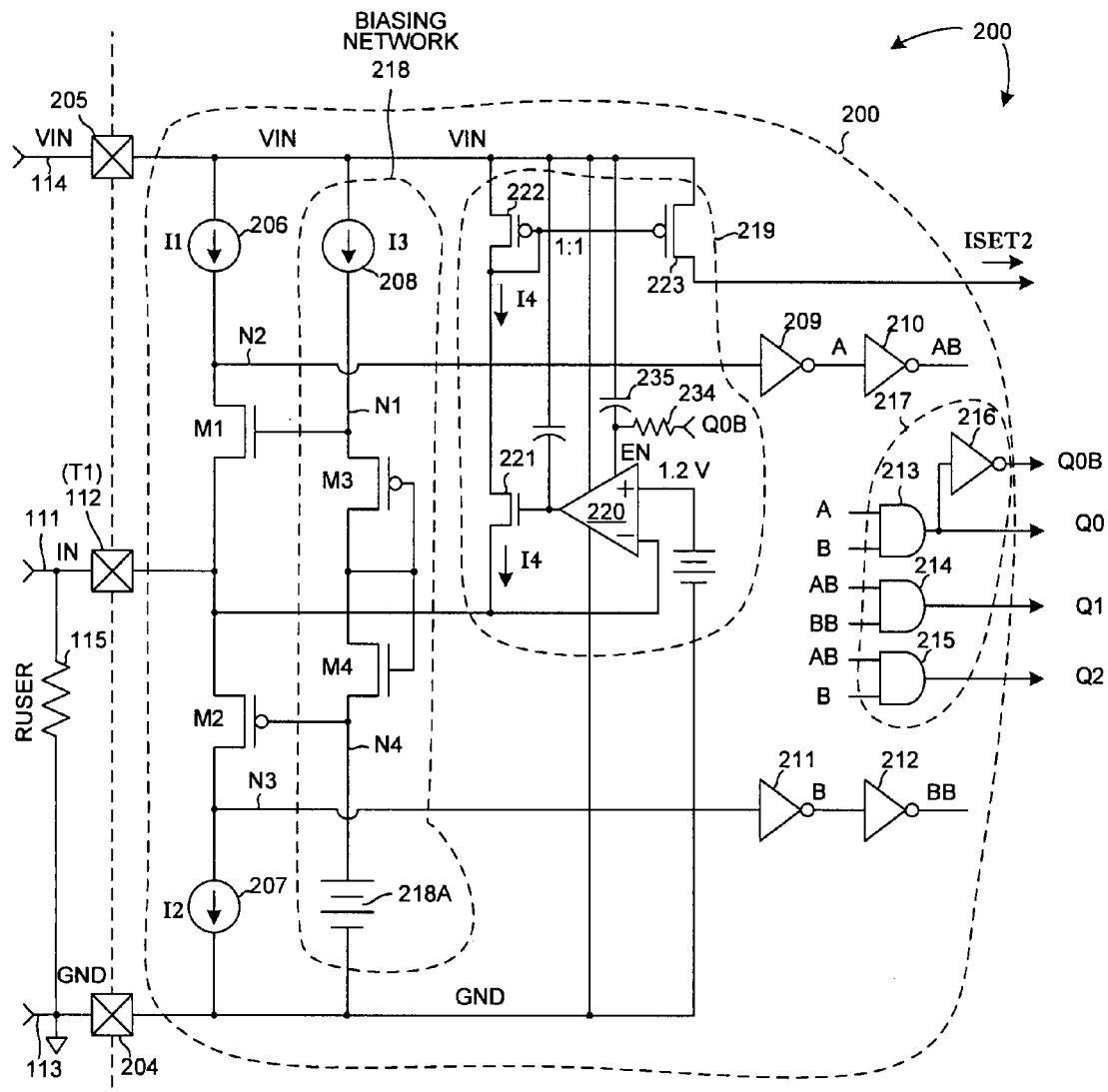
FIGS. 8 and 9 together form a circuit diagram of a circuit 200 within USB battery charger integrated circuit 109. Circuit 200 detects the state (Q0, Q1 or Q2) in which integrated circuit 109 is configured.
FIG. 10 is a table that sets forth the three states (Q0, Q1 and Q2) of operation of circuit 200 of FIGS. 8 and 9. The table also sets forth the corresponding functions performed by the USB battery charger integrated circuit 109 in each of the three states.

Reference will now be made in detail to some embodiments of the invention, examples of which are illustrated in the accompanying drawings.

FIG. 4 is a diagram of a system 100 involving a USB device 101 (in this example, a cellular telephone) that is connected by a USB cable 102 to a USB host 103 (in this example, a personal computer). USB host 103 includes USB circuitry 104. USB device 101 includes USB circuitry 105. USB cable 102 has a standard USB plug 106 that plugs into an accommodating USB port 107 on USB host 103 so that the USB host can read from, and write to, the USB circuitry 105 in USB device 101 over two data lines D+ and D− in USB cable 102. USB cable 102 also provides a supply voltage power conductor VIN as well as a ground conductor GND. These conductors are usable to power circuitry that is external to USB host 103. The USB port 107 is specified to supply 5.0 volts between its conductors VIN and GND, but the USB host may, depending on the configuration, either supply a maximum of 100 milliamperes of supply current or a maximum of 500 milliamperes of supply current.

In the illustrated system, USB host 103 and USB port 107 are used to recharge a rechargeable lithium-ion battery 108 in cellular telephone 101. Block 101A is an expanded view of a part of cellular telephone 101. Block 101A includes a novel battery charger integrated circuit 109 that is coupled to USB circuitry 105 in a novel fashion. Battery charger integrated circuit 109 is also coupled to the conductors VIN and GND in USB cable 102 as illustrated. The charger integrated circuit 109 receives power from the USB cable 102 via the supply voltage conductor VIN and the ground conductor GND, and in turn uses that power to recharge battery 108.

FIG. 5 illustrates the manner of charging. In a first fast charge phase, the battery charger integrated circuit 109 charges battery 108 with a constant current I-CONST. Then, once the battery voltage VBATT reaches a predetermined voltage V-CONST, the battery charger integrated circuit 109 switches to a constant voltage charging mode. This constant voltage mode is sometimes referred to as the "top off" phase. After charger integrated circuit 109 has transferred energy into battery 108 in this constant voltage charging mode such that the battery voltage VBATT has remained in a predetermined charged range for a predetermined amount of time, the battery charger integrated circuit 109 stops supplying energy to battery 108. This is illustrated by the vertical line 110 in FIG. 5.

As set forth above, USB port 107 may only be able to supply a current of 100 milliamperes of supply current, or USB port 107 may be able to supply a current of 500 milliamperes of supply current. It is desired to charge battery 108 with a higher constant current during the fast charge phase if the USB port is able to supply the increased amount of charge current. Accordingly, charger integrated circuit 109 charges during the constant current phase at 500 milliamperes if USB port 107 is able to supply 500 milliamperes of supply current across the VIN and GND conductors. USB circuitry 104 in USB host 103 writes information into the USB circuitry 105 in the cellular telephone 101 that indicates the amount of supply current that the host can output onto its USB port 107. USB circuitry 105 in turn supplies this information to the battery charger integrated circuit 109 in the form of signal that can have two digital logic levels. If USB circuitry 105 drives the digital logic signal IN and conductor 111 to have a first digital logic value such that a terminal (T1) 112 is coupled to the ground conductor GND 113, then the supply current supplied from USB port 107 has a first maximum amount of 100 milliamperes), whereas if the USB circuitry 105 drives the signal IN and conductor 111 to have a second digital logic value such that the terminal (T1) 112 is coupled to the VIN conductor 114, then the supply current supplied from USB port 107 has a second maximum amount of 500 milliamperes. Battery charger integrated circuit 109 receives this IN signal on a single terminal (T1) 112.

USB host 103 (in this case, the personal computer) in the present example can also cause the charger integrated circuit 109 to charge battery 108 with a constant current that is said to be "user" selectable value. The term "user" here generally refers to the manufacturer of the cellular telephone or the "user" of USB battery charger integrated circuit 109 who purchases the integrated circuit and builds it into a product such as cellular telephone 101. The constant current with which charger integrated circuit 109 charges battery 108 is determined by the resistance of an external resistor 115 that is coupled to terminal T1. External resistor 115 is external to the charger integrated circuit 109. Although USB host 103 cannot, in this particular embodiment, disable charger integrated circuit 109 as in the prior art example of FIGS. 1-3, the charger integrated circuit 109 has a fewer number of terminals through which charger integrated circuit 109 communicates with USB circuitry 105.

FIG. 6 is a table that shows the function or configuration of USB battery charger integrated circuit 109. If terminal T1 is "tied low" or otherwise is coupled to the digital logic low voltage on conductor GND 113 by a short or a relatively low impedance, then the signal IN is said to be in a digital logic low state of "0". Charger integrated circuit 109 detects this "0" state and sets the maximum value of the constant current with which battery 108 is charged to be 100 milliamperes. If terminal T1 is "tied high" or otherwise is coupled to the digital logic high voltage on conductor VIN 114 by a short or a relatively low impedance, then the signal IN is said to be in a digital logic high state of "1". Charger integrated circuit 109 detects this "1" state and sets the maximum value of the constant current with which battery 108 is charged to be 500 milliamperes. If terminal T1 is not "tied high" or "tied low", then terminal T1 in the specific embodiment of FIG. 4 is coupled by a relatively large resistance of external resistor 115 to ground potential. This high impedance state is denoted "R" in the table of FIG. 6. Charger integrated circuit 109 detects this "R" state and sets the maximum value of the constant current with which battery 108 is charged to a current value that is a predetermined function of the resistance of external resistor 115.

FIG. 7 is a table that sets forth the terminals of USB battery charger integrated circuit 109. Note that there are five terminals, in contrast to the six terminals of the conventional USB battery charger integrated circuit of FIG. 1. When the battery charging process of FIG. 5 is completed, then charger integrated circuit 109 drives a current from a "charge finish" terminal 116 that flows through light emitting diode (LED) 117, thereby emitting a visual indication that battery 108 is charged. Alternatively, the LED 117 can be made to emit light if the battery 108 is in the process of being charged and the LED 117 is not emitting light if charging has been completed.

Figure 9:
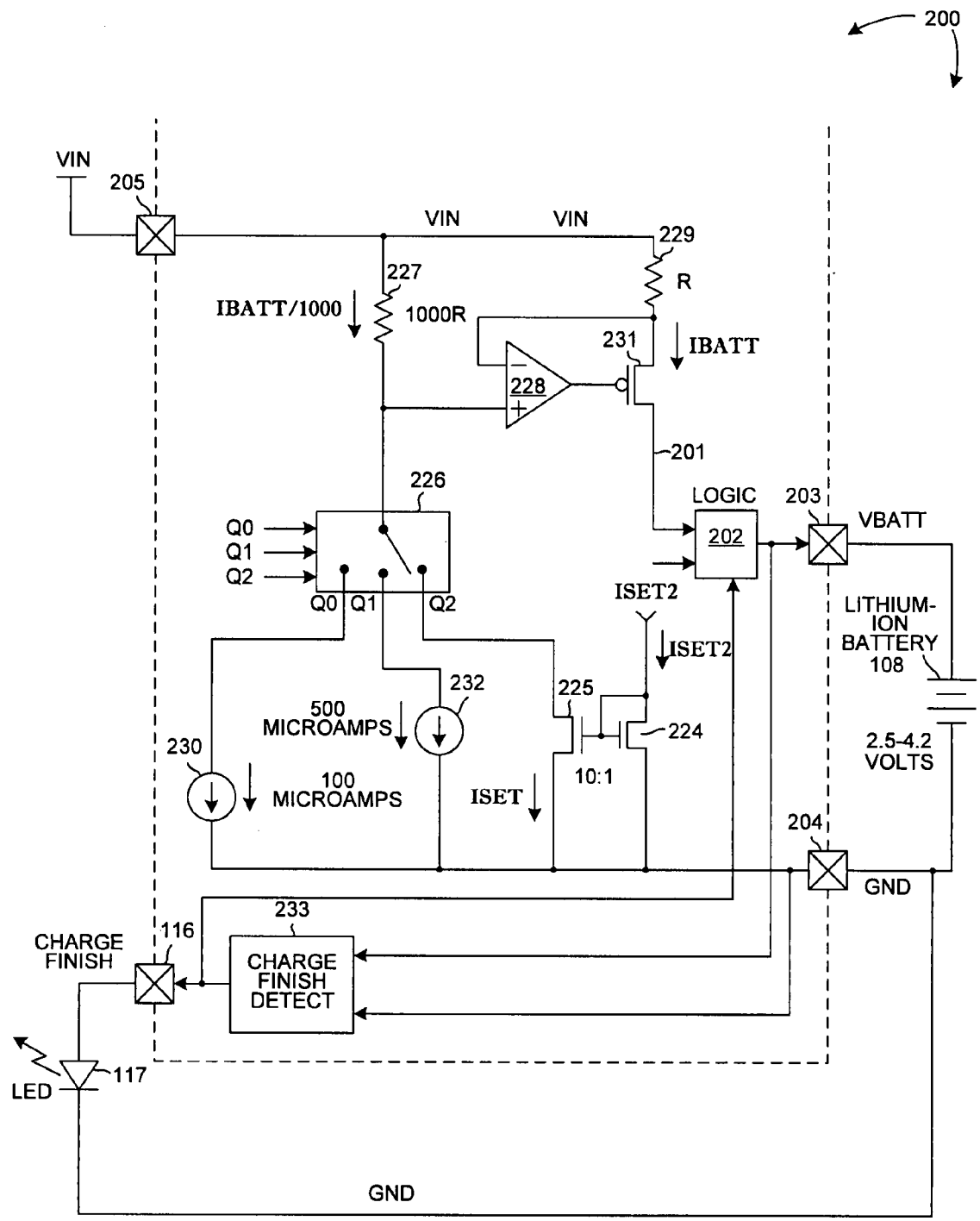

FIGS. 8 and 9 together are a circuit diagram of a novel circuit 200 within USB battery charger integrated circuit 109. Circuit 200 determines: 1) whether the terminal 112 (T1) is coupled external to integrated circuit 109 by a relatively low impedance to the GND conductor 113 (this is called state Q0), or 2) whether the terminal 112 (T1) is coupled external to integrated circuit 109 by a relatively low impedance to the VIN conductor 114 (this is called state Q1), or 3) whether the terminal 112 (T1) is floating or is coupled external to integrated circuit 109 by a relatively high impedance to a source of a DC voltage such as to GND conductor 113 (this is called state Q2).

If circuit 200 determines that terminal 112 (T1) is in state Q0, then circuit 200 supplies a current IBATT on conductor 201. In this embodiment current IBATT is supplied in the constant current fast charge phase of battery charging through logic and multiplexer circuit 202, and through VBATT terminal 203, and to battery 108. In state Q0, this current has a magnitude of 100 milliamperes. If circuit 200 determines that terminal 112 (T1) is in state Q1, then circuit 200 supplies the current IBATT on conductor 201 such that IBATT has a magnitude of 500 milliamperes. If circuit 200 determines that terminal 112 (T1) is in state Q2, then circuit 200 supplies the current IBATT on conductor 201 such that IBATT has a magnitude $12 \times 10^6/R$ milliamperes, where R is in units of ohms. R is the resistance of external resistor 115. The table of FIG. 10 sets forth the function of circuit 200 in each of the states Q0, Q1 and Q2.

Circuit 200 of FIGS. 8 and 9 operates as set forth below.

State Q2:

Current source 206 is a non-ideal current source that sources a current I1. Current source 207 is a non-ideal current source that sources a current I2. Currents I1 and I2 are approximately equal. Current source 208 is a non-ideal current source that sources a current I3. I3 is substantially smaller than current I1.

Assume for explanation purposes that terminal 112 (T1) is floating and is entirely disconnected from all other nodes. Assume resistor 115 were not present. N-channel field effect transistor (NFET) M1 and P-channel field effect transistor (PFET) M2 are biased to be only slightly conductive in this condition. NFET M1 is biased to conduct less current than current I1. Current source 206 is a non-ideal current source and pulls node N2 up toward voltage VIN. The voltage VIN on node N2 is a digital logic high voltage. Digital logic inverter 209 detects this condition and asserts signal A to a digital logic low value. Inverter 210 in turn asserts signal AB to, a digital logic high value ("B" here stands for "bar" or the inverse of signal A). Note that in the table of FIG. 10, in state Q2, signal A is designated as being a digital "0" and signal AB is designated as being a digital "1".

Similarly, PFET M2 is biased to conduct less current than current I2. Current source 207 therefore pulls node N3 down toward the ground potential on terminal 204. This voltage on node N3 is a digital logic low voltage. Accordingly, inverter 211 asserts signal B to a digital logic high value, and inverter 212 asserts signal BB to a digital logic low value. Note that in the table of FIG. 10, in state Q2, signal B is designated as being a digital "1" and signal BB is designated as being a digital "0".

AND gates 213-215 and inverter 216 form a digital decoder 217. Decoder 217 detects the condition of signal AB being asserted high and signal B being asserted high, and outputs signal Q2 to be a digital logic high. The other state output signals Q0 and Q1 are not asserted high. Note that in the table of FIG. 10, in state Q2, signal Q2 is a digital logic high level, whereas signals Q0 and Q1 are digital logic low levels.

A biasing network 218 biases the gates of transistors M1 and M2 to be in the slightly conductive mode. Each of the transistors M3 and M4 is diode-connected so that the potential between the gates of transistors M1 and M2 is approximately two forward bias diode voltage drops. This biases the voltage drop between the gates of transistors M1 and M2 at approximately two threshold voltages, so transistors M1 and M2 are only slightly conductive. Voltage drop element 218A sets node N4 at a DC bias voltage above ground potential, but is optional. Voltage drop element 218A may, for example, be an appropriately sized resistor that sets the voltage on node N4 to 0.5 volts. Current source 208 provides current through diode-connected transistors M3 and M4 to establish a voltage drop through transistors M3 and M4 to set up the gate bias voltages on nodes N1 and N4.

In the example of FIGS. 4-10, however, the external resistor 115 is provided to establish a relatively high impedance connection between terminal 112 (T1) and GND terminal 204. This resistance is high enough that it does not pull down on the source of NFET M1 so much that NFET M1 draws as much current as I1. Moreover, current source circuit 219 maintains the voltage on terminal 112 at 1.2 volts as long as the required current is less than the maximum allowable current of current source circuit 219. Therefore NFET M1 draws less current than current I1, and node N2 remains at a digital logic high and decoder 217 continues to detect the Q2 state.

Circuit 200 includes a current source circuit 219. Current source circuit 219 includes a differential amplifier 220 having an inverting input lead, a non-inverting input lead, an enable input lead EN, and an output lead. The non-inverting input lead is coupled to receive a 1.2 volt reference voltage as illustrated. In operation, the high gain amplifier 220 operates to keep the voltages on its non-inverting and inverting input leads substantially identical. During operation of the amplifier, the non-inverting input lead is therefore also at a voltage of approximately 1.2 volts. Because the non-inverting input lead is connected to the terminal 112 (T1) as illustrated, 1.2 volts is present on terminal 112 (T1) and 1.2 volts is dropped across external resistor 115. The current flowing through resistor 115 is equal to 1.2 volts divided by the resistance of resistor 115. Substantially no current flows into the high input impedance non-inverting input lead of amplifier 220. The current flowing through external resistor 115 therefore must also flow through N-channel transistor 221. This current is denoted I4. The magnitude of current I4 is set by setting the resistance of external resistor 115. Current I4 is mirrored through a current mirror involving P-channel transistors 222 and 223 to generate a proportionate current ISET2. PFET 223 may be larger than PFET 222 so that current ISET2 is a multiple of current I4. In the present example, the sizes of PFET 222 and 223 are the same.

As illustrated in FIG. 9, current ISET2 is again mirrored by an NFET current mirror involving N-channel transistors 224 and 225. The resulting current ISET is made to pass through a three-way switching circuit 226. Switching circuit 226 is controlled by the digital state signals Q0, Q1 and Q2 so that it couples its Q2 switch node to its output node when Q2 is asserted high. The current ISET therefore is made to flow across resistor 227 because the non-inverting input lead of differential amplifier 228 is a high impedance input. Differential amplifier 228 operates to make the voltages on its non-inverting and inverting input leads substantially identical. The voltage drop across resistor 227 is therefore made to be the same as the voltage drop across resistor 229. By making the resistance of resistor 229 one thousand times smaller than the resistance of resistor 227, the current IBATT is made to be one thousand times as large and the current ISET. This current IBATT is made to flow through conductor 201, through logic and switching circuit 202, and out of VBATT terminal 203, and to charge battery 108 as described above. The magnitude of this current in milliamperes is approximately $12 \times 10^6$ divided by R, where R is the resistance of external resistor 115.

If, rather than there being external resistor 115 coupled between terminal 112 (T1) and ground conductor 204, there were no resistor or other circuitry and terminal 112 were floating. Then no current could flow out of terminal 112. In such a configuration, the current source circuit 219 would conduct no current through NFET 221, current I4 would be zero, and current IBATT on conductor 201 would also be zero. This is a "no charge" or "disabled" state in which battery charging is disabled. Providing USB host 103 the ability to disable battery charging in the specific embodiment of FIG. 4 requires that there be no external resistor 115. Consequently, there is no user settable current IBATT. In state Q2, IBATT is zero. This assumes an ideal circuit with zero offset in amplifier 220 and exact matching between non-ideal current sources I1 and I2. Any offset error due to input offset voltage of amplifier 220 or mismatch between I1 and I2 is amplified by 10,000 and output to VBATT terminal 203 to charge the battery. Additional circuitry, not shown in FIGS. 8 and 9, detects a minimum current value, ISET2<IMIN, and makes IBATT=0 when this condition is detected.

As illustrated in FIG. 9, a charge finish detect circuit 233 is provided. When the charging cycle of FIG. 5 has been completed, charge finish detect circuit 233 drives LED 117 in such a way as to indicate that the battery 108 is charged. Alternatively, it stops driving LED 117 so as to indicate that charging is no longer taking place.

State Q0:

If terminal 112 (T1) is shorted to ground conductor 113 or is coupled to ground conductor 113 by a short or a relatively low impedance, then the voltage on terminal 112 will be pulled down from the voltage it would have in the Q2 state. The voltage on terminal 112 is the source voltage of NFET M1. Reducing the voltage on terminal 112 therefore serves to increase the source-to-gate voltage of transistor M1 because the gate of transistor M1 is biased to have a fixed DC voltage. Transistor M1 is therefore made more and more conductive as the voltage on terminal 112 decreases until transistor M1 conducts more current than current I1 of current source 206. At this point, the voltage on node N2 is pulled down to a digital logic low voltage. Inverter 209 therefore asserts signal A to a digital logic high value and inverter 210 asserts signal AB to a digital logic low value. Note that signal A is indicated to be a digital logic "1" in the Q0 state row of the table of FIG. 10. Similarly, note that signal AB is indicated to be a digital logic "0".

Pulling the voltage on terminal 112 down reduces the source voltage on PFET M2. The gate-to-source voltage of PFET M2 is decreased. PFET M2 is therefore not made any more conductive than it was in the Q2 state. Node N3 is a digital logic low value, inverter 211 asserts signal B to a digital logic high value, and inverter 212 asserts signal BB to a digital logic low value. Note that signal B is indicated to be a digital logic "1" in the Q0 state row of the table of FIG. 10. Similarly, note that signal BB is indicated to be a digital logic "0".

Decoder 217 decodes the situation in which signal A is a digital logic high and signal B is a digital logic high, and asserts state signal Q0 to be a digital logic high. Referring to FIG. 9, note that the Q0, Q1 and Q2 signals control switching circuit 226 (see FIG. 9). Because state signal Q0 is asserted, switching circuit 226 couples the Q0 switch input to the switch output. Switch input Q0 is coupled to a 100 microampere current source 230. This 100 microampere current is therefore pulled through switching circuit 226. Due to the action of resistors 227, 229, amplifier 228 and PFET 231, the current IBATT is one thousand times the current flowing through current source 230. Current IBATT flowing through conductor 201 is therefore 100 milliamperes in state Q0.

State Q1:

If terminal 112 (T1) is shorted to digital logic high voltage VIN (5.0 volts) or is coupled to VIN conductor 114 by a relatively low impedance, then the voltage on terminal 112 will be pulled up toward voltage VIN. The voltage on terminal 112 is the source voltage of PFET M2. Increasing the voltage on terminal 112 therefore serves to increase the gate-to-source voltage of transistor M2 because the gate of transistor M2 is biased to have a fixed DC voltage by biasing network 218. Transistor M2 conducts more current than current I2. Consequently, the voltage on node M3 transitions to a digital logic high voltage. Inverter 211 asserts signal B to be a digital logic low value. Inverter 212 asserts signal BB to be a digital logic high value. Note that in the middle row of the table of FIG. 10, signal BB is shown to be asserted to a digital logic "1".

If the voltage on terminal 112 is pulled up toward voltage VIN, then the gate-to-source voltage of transistor M1 is decreased. Transistor M1 does not conduct more current than current I1. The voltage on node N2 is a digital logic high voltage. Signal A has a digital logic low value, and signal AB has a digital logic high value. Note that in the middle row of the table of FIG. 10, signal AB is shown to be asserted to a digital logic "1".

Decoder 217 decodes the condition when signal AB is a digital logic high and signal BB is a digital logic high, and asserts state signal Q1 to be a digital logic high value. Referring again to FIG. 9, signal Q1 controls switching circuit 226 such that switch input Q1 is coupled through the switching circuit 226 to its switch output. A 500 microampere current source 232 is connected to the Q1 switch input. The 500 microampere current is therefore made to flow across resistor 227. This current is magnified by amplifier 228 and PFET 231 so that current IBATT is a multiple of the 500 microampere current. This multiple is one thousand in the example of FIG. 9. A 500 milliampere current therefore flows through multiplexer and logic 202, and out of VBATT terminal 203 to charge battery 108. Current IBATT flowing through conductor 201 is therefore 500 milliamperes in state Q0.

If circuit 200 were operating in state Q0 with terminal 112 shorted to a DC potential other than 1.2 volts by a very low external impedance, and if current source circuit 219 were operational, then current source circuit 219 would attempt to drive the voltage on terminal 112 to 1.2 volts. As described above, differential amplifier 220 operates to maintain the voltages on its non-inverting and inverting input leads at the same potential. Under such a condition, due to the very low external impedance, current I4 might be an undesirably large current that could cause damage within integrated circuit 109 or waste unacceptably large amounts of power. Accordingly, transistor 221 is sized to have a smaller W and larger L so that transistor 221 will have a small maximum current conducting capability when its gate-to-source voltage is VIN. This sets the maximum value of current I4 to a level (for example, one milliampere) that does not result in damage to the circuit.

Moreover, an RC timing circuit involving resistor 234 and capacitor 235 is provided. Upon power up of circuit 200, if circuit 200 is configured in state Q0, then initially current source circuit 219 will be enabled. The enable input lead EN of differential amplifier will be at a digital logic high. The very low impedance external connection of terminal 112 to ground potential will conduct more current than transistor 221 can conduct, however, so circuit 200 will properly detect state Q0. Decoder 217 will therefore assert signal Q0B to a digital logic low level. Signal Q0B is supplied to the RC circuit, so that after a short time delay the enable input lead EN of the differential amplifier 220 will be asserted low, thereby disabling the current sourcing circuit 219. Accordingly, the high current condition when the current I4 is flowing at the beginning of entering the Q0 state is a transient condition of short duration. During subsequent normal operation of circuit 200 in state Q0, the current sourcing circuit 219 is disabled.

When circuit 200 is powered up, circuit 200 has not yet detected whether terminal 112 is tied low, tied high, or is in the floating condition. If external high resistance resistor 115 is coupled between terminal 112 and ground, and if current sourcing circuit 219 is not enabled, then there may not be enough current sourced from terminal 112 to raise the voltage of terminal 112. If this were the case and the voltage on terminal 112 remains at ground potential, then the circuit 200 will detect operation in state Q0 rather than Q2. Circuit 200 will be trapped in this condition with state Q0 being detected because there will be inadequate current supplied from terminal 112 to raise the voltage of terminal 112. In the circuit 200, however, current sourcing circuit 219 is enabled upon power up. Current sourcing circuit 219 raises the voltage on terminal 112 during the initial power up condition, thereby preventing circuit 200 from being trapped in the Q0 state.

The minimum resistance that external resistor 115 can have that still results in circuit 200 detecting operation in the Q2 state can be determined by simulating circuit 200 using a circuit simulator such as SPICE, or by experimentation with an actual implementation of the circuit. A margin is then provided between the highest resistance connection to ground potential (between terminal 112 and ground conductor 113) that will be detected by circuit 200 as state Q0 and the smallest resistance (between terminal 112 and ground conductor 113) that will be detected by circuit 200 as state Q2.

GENERAL APPLICABILITY

A circuit and methodology is described above that detects whether a terminal is either: 1) tied low or driven low, either by a short or by a relatively low external impedance (state Q0), 2) tied high or driven high, either by a short or by a relatively low external impedance (state Q1), or 3) floating or coupled to a DC voltage by a relatively high external impedance (state Q2). The circuit detects in which one of these states the terminal is, and responds by outputting digital signals indicative of the detected state. If the state is the Q2 state, then the circuit changes an operational characteristic of a portion of the circuit so that the operational characteristic has a magnitude or value that is a predetermined function of the resistance of the relatively high external impedance. The operational characteristic may be a current magnitude as is described above in connection with current IBATT, or in other embodiments the operational characteristic may be a voltage magnitude, a frequency, a capacitance, an inductance, a filter characteristic, or a time, a temperature, or setting, or other operational characteristic. The circuit and methodology performs the function of detecting the three states and setting the operational characteristic without the use of a second input terminal. It is recognized that an analog-to-digital converter could be employed to detect one of many discrete voltage levels of a voltage received on an input terminal, or that another measurement circuit could be employed to detect one of many discrete ranges of a parameter to be measured, but the above-described circuit of FIGS. 8 and 9 is much simpler than adding a multiple-bit A/D converter. A multiple-bit A/D converter generally requires the user to supply a D/A converter of similar resolution and accuracy in the integrated circuit that is used to drive terminal 112. In the USB battery charger example of FIG. 4, the novel USB battery charger integrated circuit 109 has five terminals as opposed to the six terminals in the conventional USB battery charger system of FIG. 1. This is a special application to which the novel circuit and methodology is particularly suited.

Figure 11:
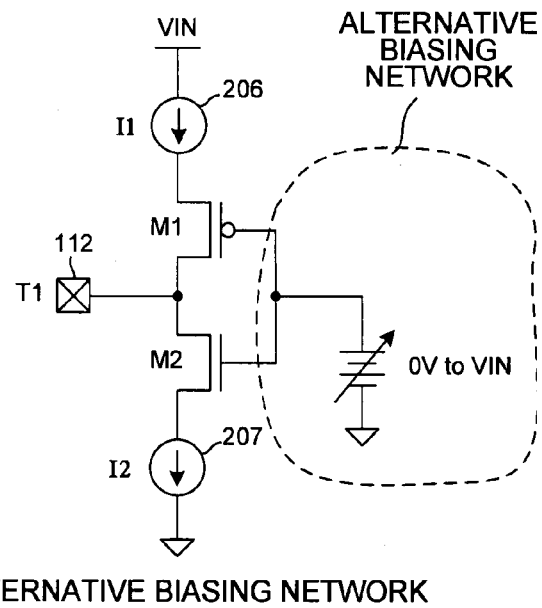
FIG. 11 is an alternative biasing network for biasing the gate voltages of transistors M1 and M2 in the circuit 200 of FIGS. 8 and 9.
Figure 12:
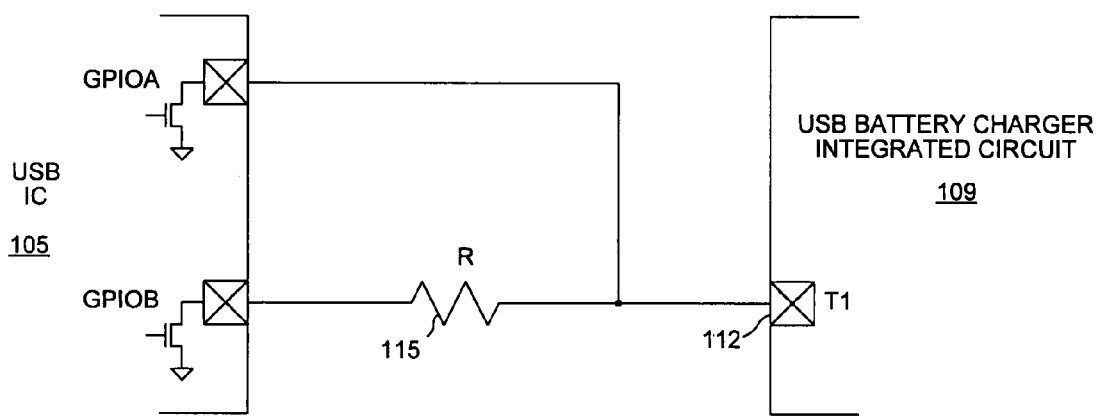
FIG. 12 is a diagram of alternative way that a USB integrated circuit (such as USB integrated circuit 105 of FIG. 4) can be coupled to the novel USB battery charger integrated circuit 109.

Although the present invention is described in connection with certain specific embodiments for instructional purposes, the present invention is not limited thereto. FIG. 11 is an alternative biasing network for biasing the gates of transistors M1 and M2 of the circuit 200 of FIGS. 8 and 9. Accordingly, various modifications, adaptations, and combinations of various features of the described embodiments can be practiced without departing from the scope of the invention as set forth in the claims.

What is claimed is:

1. An integrated circuit comprising:
   a terminal;
   a circuit that determines which of three states the terminal is in, wherein the three states are: 1) the terminal being coupled external to the integrated circuit by a relatively low impedance to a source of a digital logic high voltage, 2) the terminal being coupled external to the integrated circuit by a relatively low impedance to a source of a digital logic low voltage, and 3) the terminal being coupled external to the integrated circuit by a relatively high impedance to a source of a DC voltage; and a current source that outputs a regulated current if the circuit determines that the terminal is coupled by the relatively high impedance to the source of the DC voltage, wherein a magnitude of the regulated current is a function of a resistance of the relatively high impedance.

2. The integrated circuit of claim 1, further comprising:
a supply voltage terminal, wherein the supply voltage terminal is said source of a digital logic high voltage; and
a ground terminal, wherein the ground terminal is said source of a digital logic low voltage.

3. The integrated circuit of claim 1, wherein the circuit asserts a first digital logic signal if the circuit determines that the terminal is coupled to said source of the digital logic high voltage, wherein the circuit asserts a second digital logic signal if the circuit determines that the terminal is coupled to said source of the digital logic low voltage, and wherein the circuit asserts a third digital logic signal if the circuit determines that the terminal is coupled by the relatively high impedance to said source of the DC voltage.

4. The integrated circuit of claim 1, wherein said source of the DC voltage is a ground terminal of the integrated circuit, and wherein the ground terminal is said source of the digital logic low voltage.

5. The integrated circuit of claim 1, wherein the circuit comprises:
a first current source having a first node and a second node;
an N-channel field effect transistor (NFET) having a source, a gate and a drain, wherein the drain of the NFET is coupled to the second node of the first current source, and wherein the source is coupled to the terminal;
a P-channel field effect transistor (PFET) having a source, a gate and a drain, wherein the source of the PFET is coupled to the terminal; and
a second current source having a first node and a second node, wherein the first node of the second current source is coupled to the drain of the PFET.

6. The integrated circuit of claim 5, further comprising:
a digital logic circuit having an input lead and an output lead, wherein the input lead is coupled to the second node of the first current source.

7. An integrated circuit comprising:
a terminal;
a circuit that determines whether the terminal is coupled external to the integrated circuit by a relatively low impedance to a source of a digital logic high voltage, whether the terminal is coupled external to the integrated circuit by a relatively low impedance to a source of a digital logic low voltage, or whether the terminal is coupled external to the integrated circuit by a relatively high impedance to a source of a DC voltage, wherein the circuit comprises:
a first current source having a first node and a second node;
an N-channel field effect transistor (NFET) having a source, a gate and a drain, wherein the drain of the NFET is coupled to the second node of the first current source, and wherein the source is coupled to the terminal;
a P-channel field effect transistor (PFET) having a source, a gate and a drain, wherein the source of the PFET is coupled to the terminal; and
a second current source having a first node and a second node, wherein the first node of the second current source is coupled to the drain of the PFET;
a third current source that outputs a regulated current if the circuit determines that the terminal is coupled by the relatively high impedance to the source of the DC voltage, wherein a magnitude of the regulated current is a function of a resistance of the relatively high impedance;
a first digital logic circuit having an input lead and an output lead, wherein the input lead is coupled to the second node of the first current source; and
a second digital logic circuit having an input lead and an output lead, wherein the input lead of the second digital logic circuit is coupled to the first node of the second current source.

8. An integrated circuit comprising:
a terminal;
a circuit that determines whether the terminal is coupled external to the integrated circuit by a relatively low impedance to a source of a digital logic high voltage, whether the terminal is coupled external to the integrated circuit by a relatively low impedance to a source of a digital logic low voltage, or whether the terminal is coupled external to the integrated circuit by a relatively high impedance to a source of a DC voltage; and
a current source that outputs a regulated current if the circuit determines that the terminal is coupled by the relatively high impedance to the source of the DC voltage, wherein a magnitude of the regulated current is a function of a resistance of the relatively high impedance, and wherein the circuit comprises:
a first current source having a first node and a second node;
an N-channel field effect transistor (NFET) having a source, a gate and a drain, wherein the drain of the NFET is coupled to the second node of the first current source, and wherein the source is coupled to the terminal;
a P-channel field effect transistor (PFET) having a source, a gate and a drain, wherein the source of the PFET is coupled to the terminal;
a second current source having a first node and a second node, wherein the first node of the second current source is coupled to the drain of the PFET; and
a biasing network that biases the gate of the NFET at a first substantially constant DC voltage, and that biases the gate of the PFET at a second substantially constant DC voltage.

9. An integrated circuit comprising:
a terminal;
a circuit that determines whether the terminal is coupled external to the integrated circuit by a relatively low impedance to a source of a digital logic high voltage, whether the terminal is coupled external to the integrated circuit by a relatively low impedance to a source of a digital logic low voltage, or whether the terminal is coupled external to the integrated circuit by a relatively high impedance to a source of a DC voltage; and
a current source that outputs a regulated current if the circuit determines that the terminal is coupled by the relatively high impedance to the source of the DC voltage, wherein a magnitude of the regulated current is a function of a resistance of the relatively high impedance, and wherein the circuit comprises:

a first current source having a first node and a second node;

an N-channel field effect transistor (NFET) having a source, a gate and a drain, wherein the drain of the NFET is coupled to the second node of the first current source, and wherein the source is coupled to the terminal;

a P-channel field effect transistor (PFET) having a source, a gate and a drain, wherein the source of the PFET is coupled to the terminal; and a second current source having a first node and a second node, wherein the first node of the second current source is coupled to the drain of the PFET, wherein the circuit determines that the terminal is coupled external to the integrated circuit by the relatively low impedance to a source of the digital logic high voltage by detecting digital logic states on the drain of the NFET and on the drain of the PFET.

10. An integrated circuit comprising:

a terminal;

a circuit that determines whether the terminal is coupled external to the integrated circuit by a relatively low impedance to a source of a digital logic high voltage, whether the terminal is coupled external to the integrated circuit by a relatively low impedance to a source of a digital logic low voltage, or whether the terminal is coupled external to the integrated circuit by a relatively high impedance to a source of a DC voltage; and a current source that outputs a regulated current if the circuit determines that the terminal is coupled by the relatively high impedance to the source of the DC voltage, wherein a magnitude of the regulated current is a function of a resistance of the relatively high impedance, and wherein the current source comprises:

a transistor having gate, a source and a drain; and a differential amplifier having a first differential input lead and a second differential input lead and an output lead, wherein the first differential input lead is coupled to the terminal and to the source of the transistor, and wherein the output of the differential amplifier is coupled to the gate of the transistor.

11. An integrated circuit comprising:

a terminal;

a circuit that determines whether the terminal is coupled external to the integrated circuit by a relatively low impedance to a source of a digital logic high voltage, whether the terminal is coupled external to the integrated circuit by a relatively low impedance to a source of a digital logic low voltage, or whether the terminal is coupled external to the integrated circuit by a relatively high impedance to a source of a DC voltage; and a current source that outputs a regulated current if the circuit determines that the terminal is coupled by the relatively high impedance to the source of the DC voltage, wherein a magnitude of the regulated current is a function of a resistance of the relatively high impedance, and wherein the current source is disabled if the circuit determines that the terminal is coupled external to the integrated circuit by the relatively low impedance to the source of a digital logic low voltage.

12. An integrated circuit comprising:

a terminal;

a first current source having a first node and a second node;

an N-channel field effect transistor (NFET) having a source, a gate and a drain, wherein the drain of the NFET is coupled to the second node of the first current source, and wherein the source is coupled to the terminal;

a P-channel field effect transistor (PFET) having a source, a gate and a drain, wherein the source of the PFET is coupled to the terminal;

a second current source having a first node and a second node, wherein the first node of the second current source is coupled to the drain of the PFET;

a biasing network that biases the gates of the NFET and PFET with a DC voltage; and digital decoding circuitry that has a first input coupled to the drain of the NFET and that has a second input coupled to the drain of the PFET.

13. The integrated circuit of claim 12, wherein the first current source can source a first current I1, wherein the second current source can source a second current I2, and wherein if the terminal is floating then the NFET conducts less current than first current I1 and the PFET conducts less current than second current I2.

14. The integrated circuit of claim 13, further comprising a supply voltage terminal, wherein if the terminal is coupled to the supply voltage terminal by circuitry external to the integrated circuit then: 1) the NFET is substantially nonconductive, and 2) the PFET conducts more current than second current I2.

15. The integrated circuit of claim 14, wherein the second current source is not an ideal current source, and wherein if the PFET is made to conduct more current than second current I2 then a voltage on the drain of the PFET increases, whereas if the PFET is made to conduct less current than second current I2 then the voltage on the drain of the PFET decreases.

16. The integrated circuit of claim 12, further comprising:

a programmable current source that outputs a current, wherein a magnitude of the current is dependent upon a resistance of a resistor coupled to the terminal, wherein the resistor is external to the integrated circuit.

17. The integrated circuit of claim 16, further comprising:

a ground terminal, and wherein the programmable current source is automatically disabled if the terminal is shorted to the ground terminal by circuitry external to the integrated circuit.

18. A method comprising:

(a) determining which of three states an integrated circuit terminal is in, wherein the three states are: 1) the integrated circuit terminal being shorted to a source of a digital logic high voltage, 2) the terminal being shorted to a source of a digital logic low voltage, and 3) the terminal being either floating or being coupled to a source of a DC potential by a relatively high impedance, wherein the determination (a) is made by a circuit internal to an integrated circuit of which the terminal is a part;

(b) asserting a first digital logic signal if it is determined in (a) that the integrated circuit terminal is shorted to a source of a digital logic high voltage;

(c) asserting a second digital logic signal if it is determined in (a) that the integrated circuit terminal is shorted to a source of a digital logic low voltage;

(d) asserting a third digital logic signal if it is determined in (a) that the integrated circuit terminal is either floating or is coupled to a source of a DC potential by a relatively high impedance, wherein said asserting of (b), (c) and (d) is performed by the circuit internal to the integrated circuit; and (e) supplying a regulated current if it is determined in (a) that the integrated circuit terminal is either floating or is coupled to a source of a DC potential by a relatively high impedance, wherein a magnitude of the regulated current is determined by a resistance of an external resistor coupled to the integrated circuit terminal, wherein the external resistor is external to the integrated circuit.

19. The method of claim 18, wherein the source of the digital logic high voltage is a voltage supply terminal of the integrated circuit, wherein the source of the digital logic low voltage is a ground terminal of the integrated circuit, and wherein the source of the DC potential is the ground terminal of the integrated circuit.

20. An integrated circuit comprising:
a terminal; and
means for determining which of three states the terminal is in, wherein the three states are: (a) the terminal being coupled external to the integrated circuit by a short or a relatively low impedance to a source of a digital logic high voltage, (b) the terminal being coupled external to the integrated circuit by a short or a relatively low impedance to a source of a digital logic low voltage, and (c) the terminal being either floating or being coupled external to the integrated circuit by a relatively high impedance to a source of a DC voltage, wherein the means asserts a first digital logic signal if the means determines that the terminal is in state (a), wherein the means asserts a second digital logic signal if the means determines that the terminal is in state (b), and wherein the means asserts a third digital logic signal if the means determines that the terminal is in state (c).

21. The integrated circuit of claim 20, wherein the means is also for supplying a regulated current if the means determines (c), wherein the regulated current has a magnitude that depends on a resistance of an external resistor coupled to the terminal, wherein the external resistor is external to the integrated circuit.

22. An integrated circuit comprising:
a terminal;
a circuit that determines whether the terminal is coupled external to the integrated circuit by a relatively low impedance to a source of a digital logic high voltage, whether the terminal is coupled external to the integrated circuit by a relatively low impedance to a source of a digital logic low voltage, or whether the terminal is coupled external to the integrated circuit by a relatively high impedance to a source of a DC voltage, wherein the circuit comprises:
a first current source having a first node and a second node;
an N-channel field effect transistor (NFET) having a source, a gate and a drain, wherein the drain of the NFET is coupled to the second node of the first current source, and wherein the source is coupled to the terminal;
a P-channel field effect transistor (PFET) having a source, a gate and a drain, wherein the source of the PFET is coupled to the terminal;
a second current source having a first node and a second node, wherein the first node of the second current source is coupled to the drain of the PFET; and
a biasing network that biases the gate of the NFET at a first substantially constant DC voltage, and that biases the gate of the PFET at a second substantially constant DC voltage, wherein the biasing network comprises:
a third current source having a first node and a second node; a first transistor having a source, a gate, and a drain, wherein the source of the first transistor is coupled to the second node of the third current source; and
a second transistor having a source, a gate, and a drain, wherein the drain of the second transistor is coupled to the drain of the first transistor, the gate of the first transistor, and the gate of the second transistor; and
a fourth current source that outputs a regulated current if the circuit determines that the terminal is coupled by the relatively high impedance to the source of the DC voltage, wherein a magnitude of the regulated current is a function of a resistance of the relatively high impedance.

23. An integrated circuit comprising:
a terminal; and
means for determining which of three states the terminal is in, wherein the three states are: 1) the terminal being tied low external to the integrated circuit, 2) the terminal being tied high external to the integrated circuit, and 3) the terminal floating or substantially floating, wherein if the means determines that the terminal is floating or is substantially floating then the means changes an operational characteristic of a portion of the means, wherein a magnitude of the operational characteristic is a function of a resistance of a resistor coupled to the terminal, wherein the resistor is external to the integrated circuit, and wherein the operational characteristic is taken from the group consisting of: a current magnitude, a voltage magnitude, a frequency, a capacitance, an inductance, a filter characteristic, a time, a setting, and a temperature.

* * * * *